United States Patent
Jang et al.

(10) Patent No.: US 9,449,835 B2
(45) Date of Patent: Sep. 20, 2016

(54) METHODS OF FORMING FEATURES HAVING DIFFERING PITCH SPACING AND CRITICAL DIMENSIONS

(71) Applicant: GLOBALFOUNDRIES Inc., Grand Cayman (KY)

(72) Inventors: Linus Jang, Clifton Park, NY (US); Ryan Ryoung-Han Kim, Albany, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/676,097

(22) Filed: Apr. 1, 2015

(65) Prior Publication Data

US 2016/0163555 A1   Jun. 9, 2016

Related U.S. Application Data

(60) Provisional application No. 62/088,279, filed on Dec. 5, 2014.

(51) Int. Cl.
*H01L 21/00* (2006.01)
*H01L 21/308* (2006.01)
*H01L 21/8234* (2006.01)
*H01L 21/311* (2006.01)

(52) U.S. Cl.
CPC ....... *H01L 21/3086* (2013.01); *H01L 21/3085* (2013.01); *H01L 21/31144* (2013.01); *H01L 21/823456* (2013.01)

(58) Field of Classification Search
CPC ........... H01L 21/3086; H01L 21/3085; H01L 21/31144
See application file for complete search history.

(56) References Cited

U.S. PATENT DOCUMENTS 8,513,131 B2 *  8/2013  Cai ..................... H01L 21/3086
                                                              246/12
9,209,037 B2 * 12/2015  Cantone .............. H01L 21/3086

* cited by examiner

*Primary Examiner* — Richard Booth
(74) *Attorney, Agent, or Firm* — Amerson Law Firm, PLLC

(57) ABSTRACT

Methods of forming features having differing pitch spacing and critical dimensions are disclosed herein. One method includes forming an underlying layer of material above a semiconductor substrate. The method further includes forming a masking layer above the underlying layer of material. The masking layer includes features positioned above a first region of the substrate and features positioned above a second region of the substrate. The features have different pitch spacing and critical dimensions. The method further includes performing at least one etching process on the underlying layer of material through the masking layer.

18 Claims, 13 Drawing Sheets

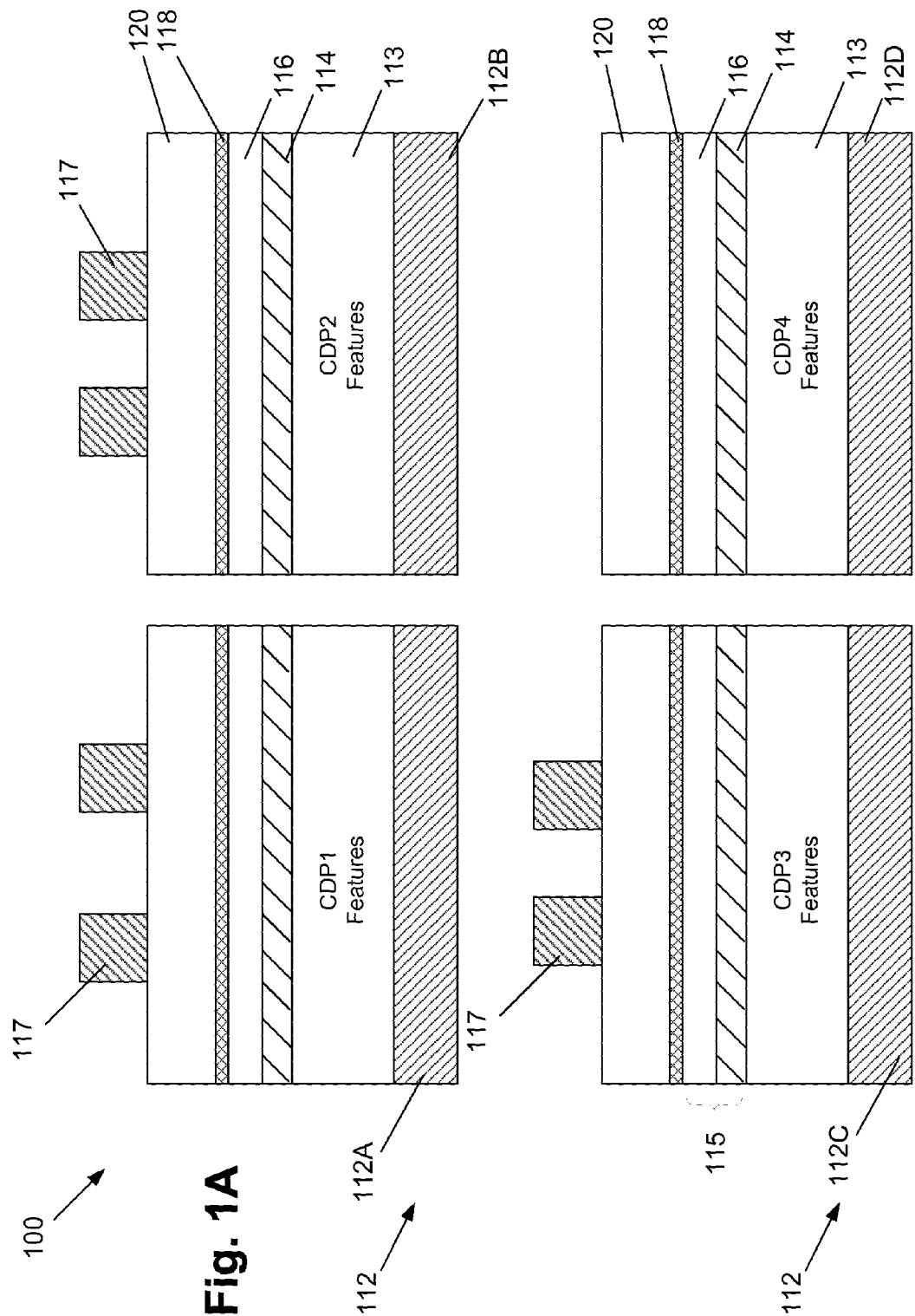

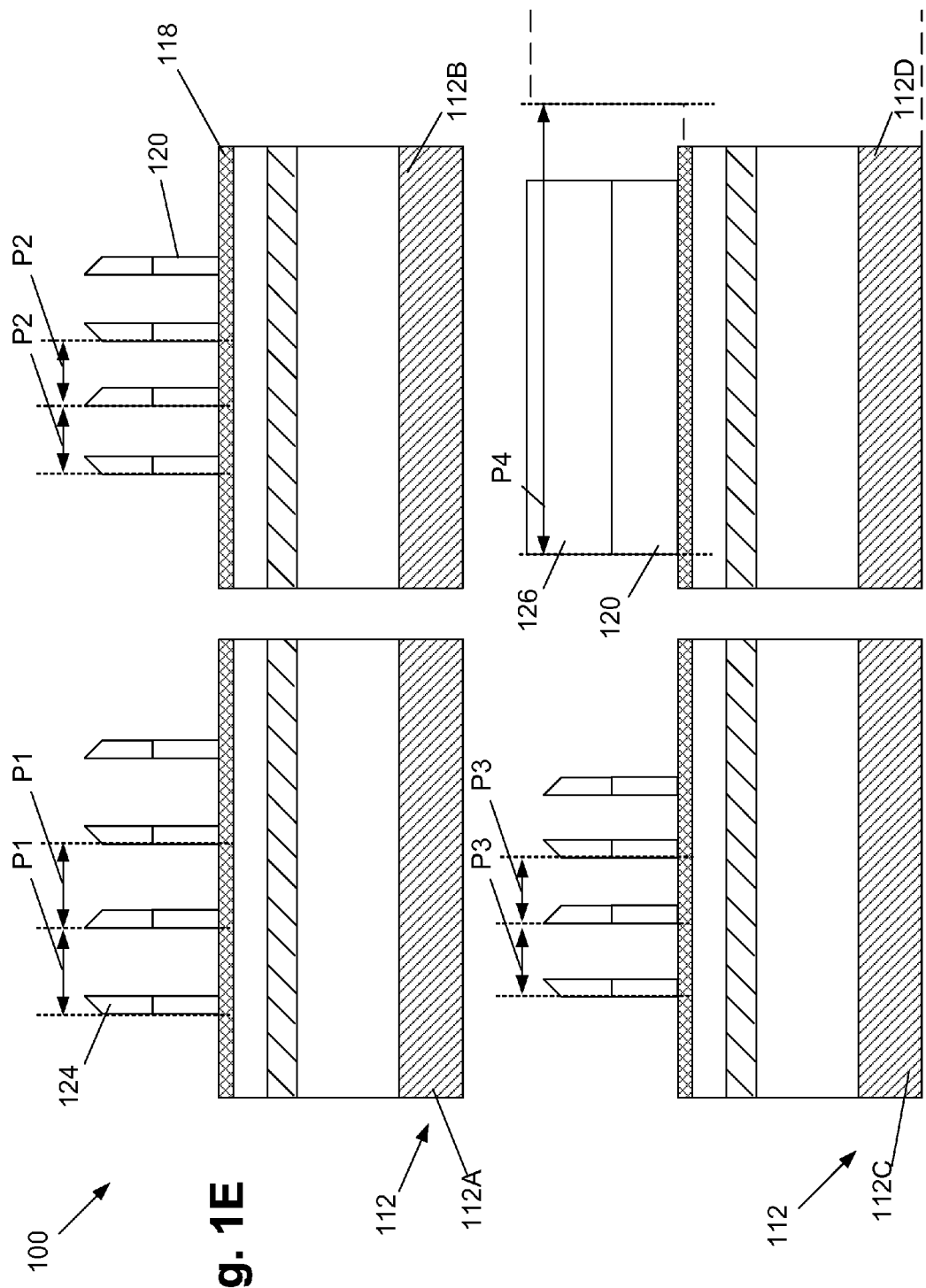

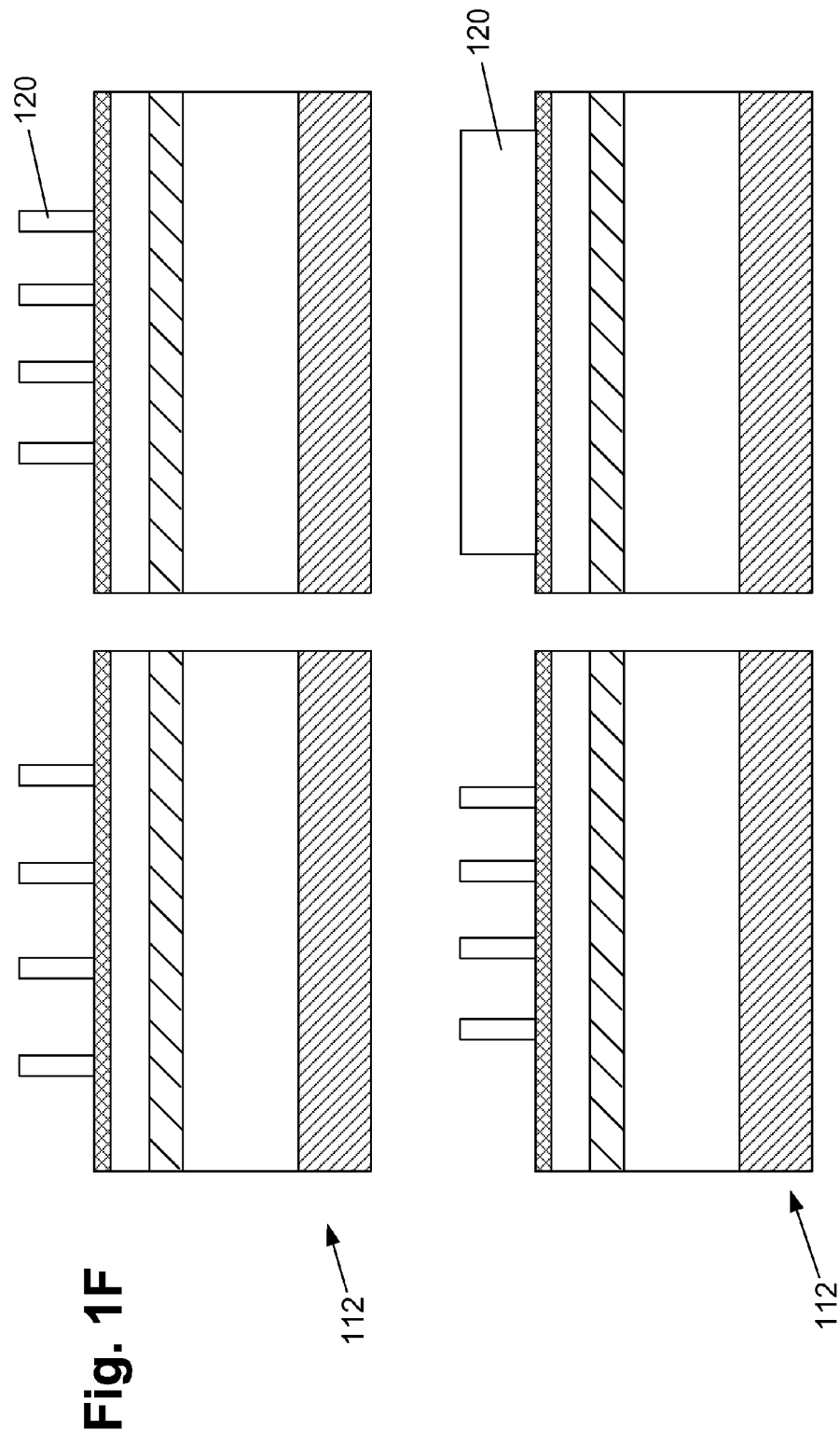

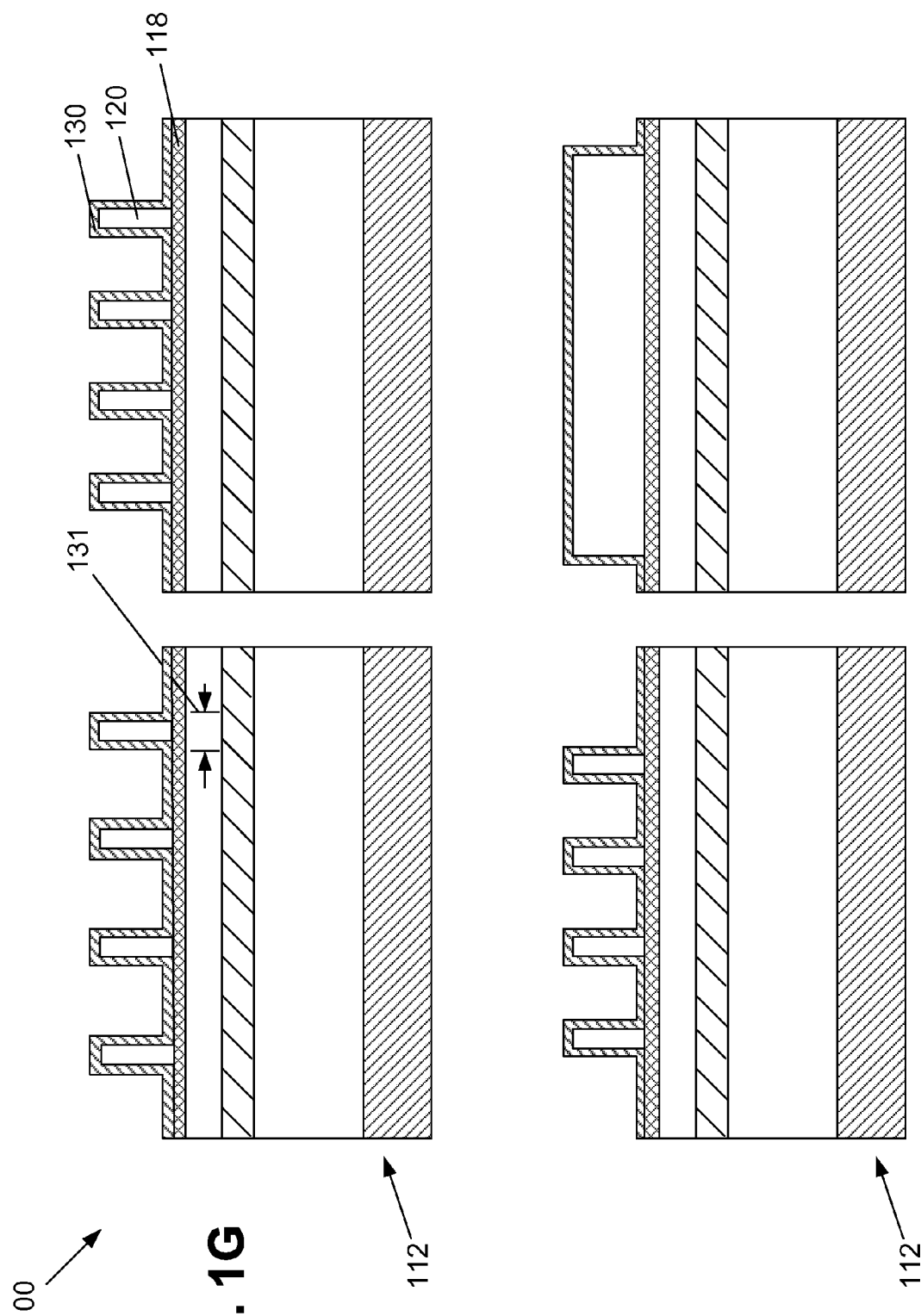

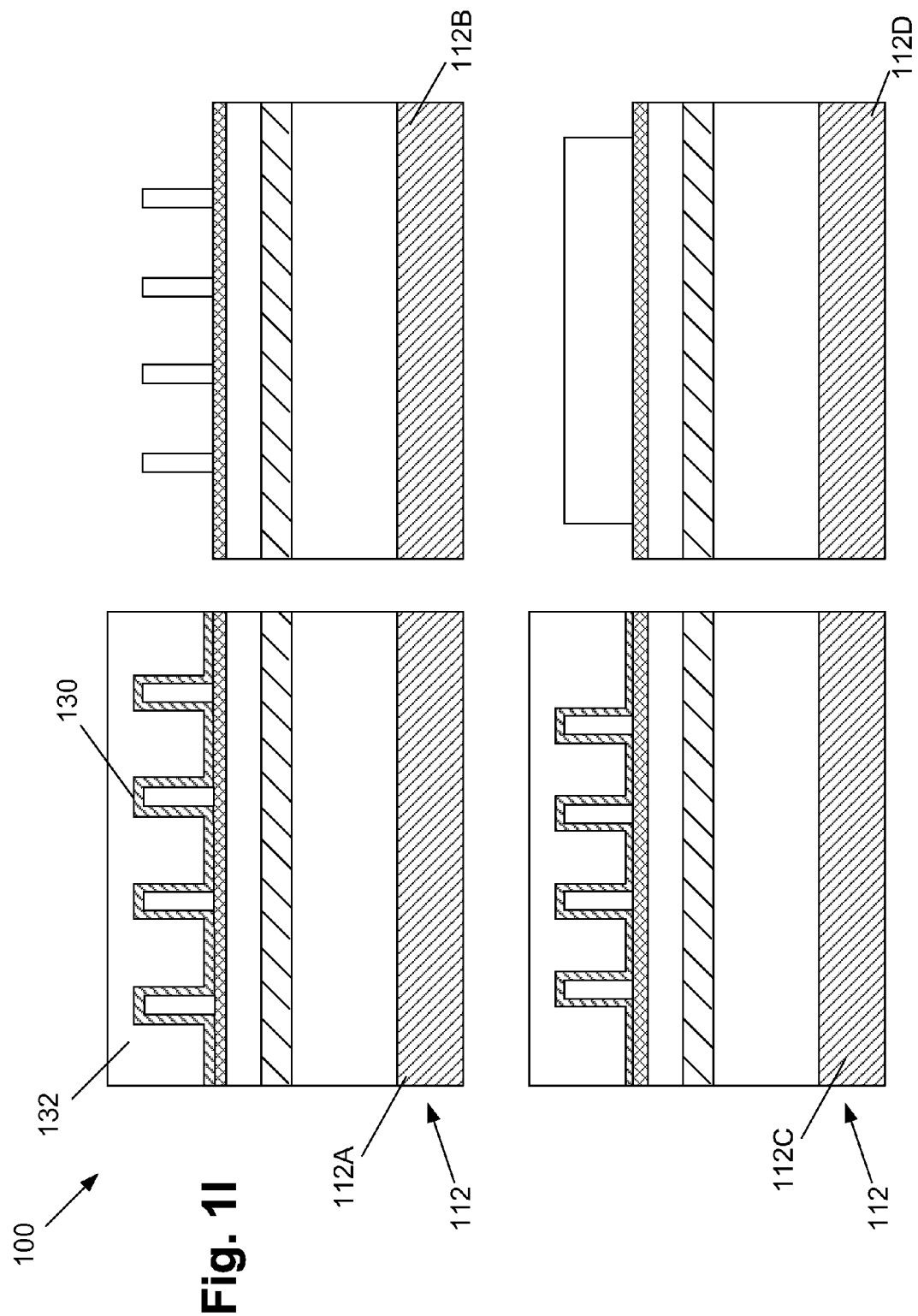

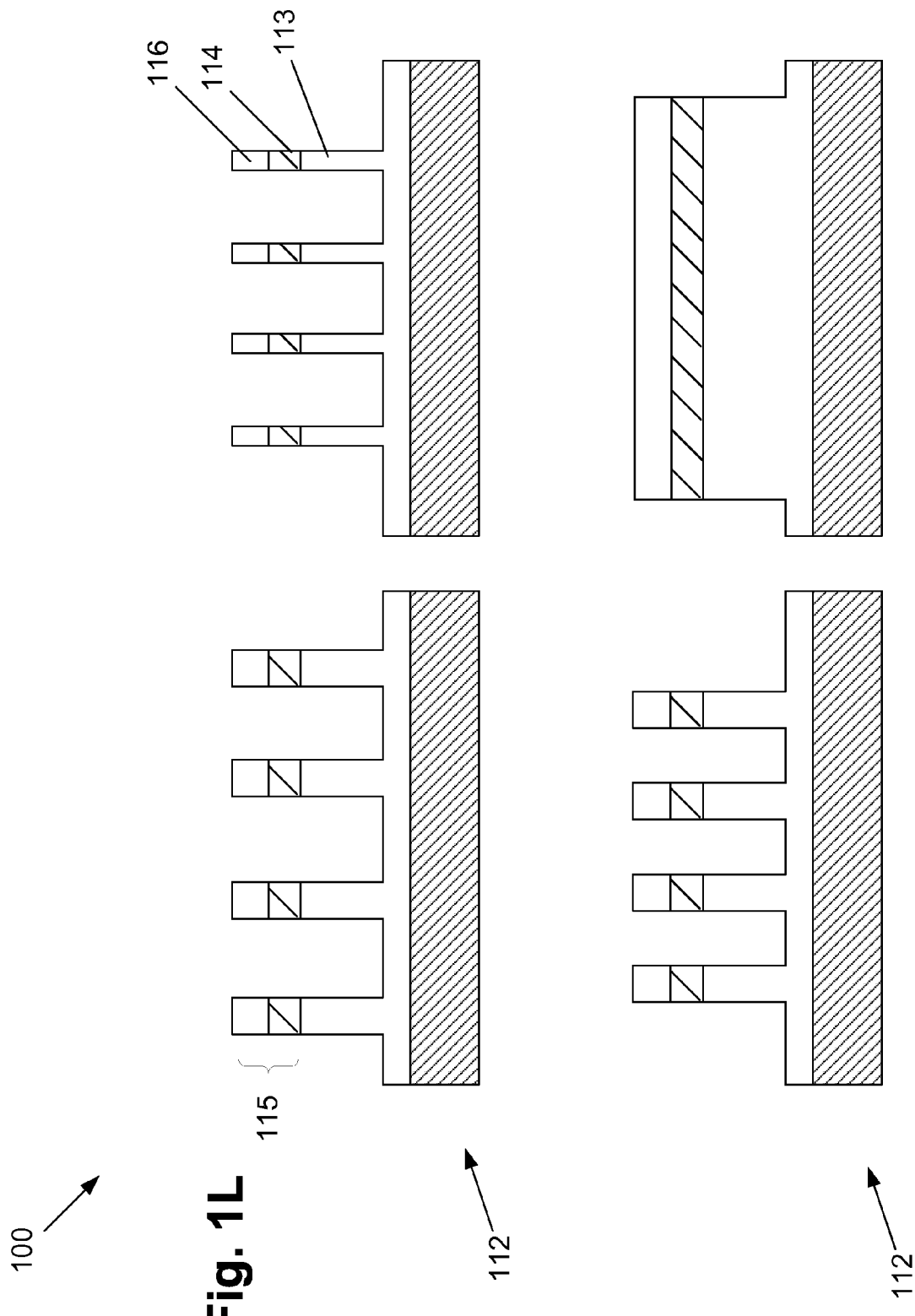

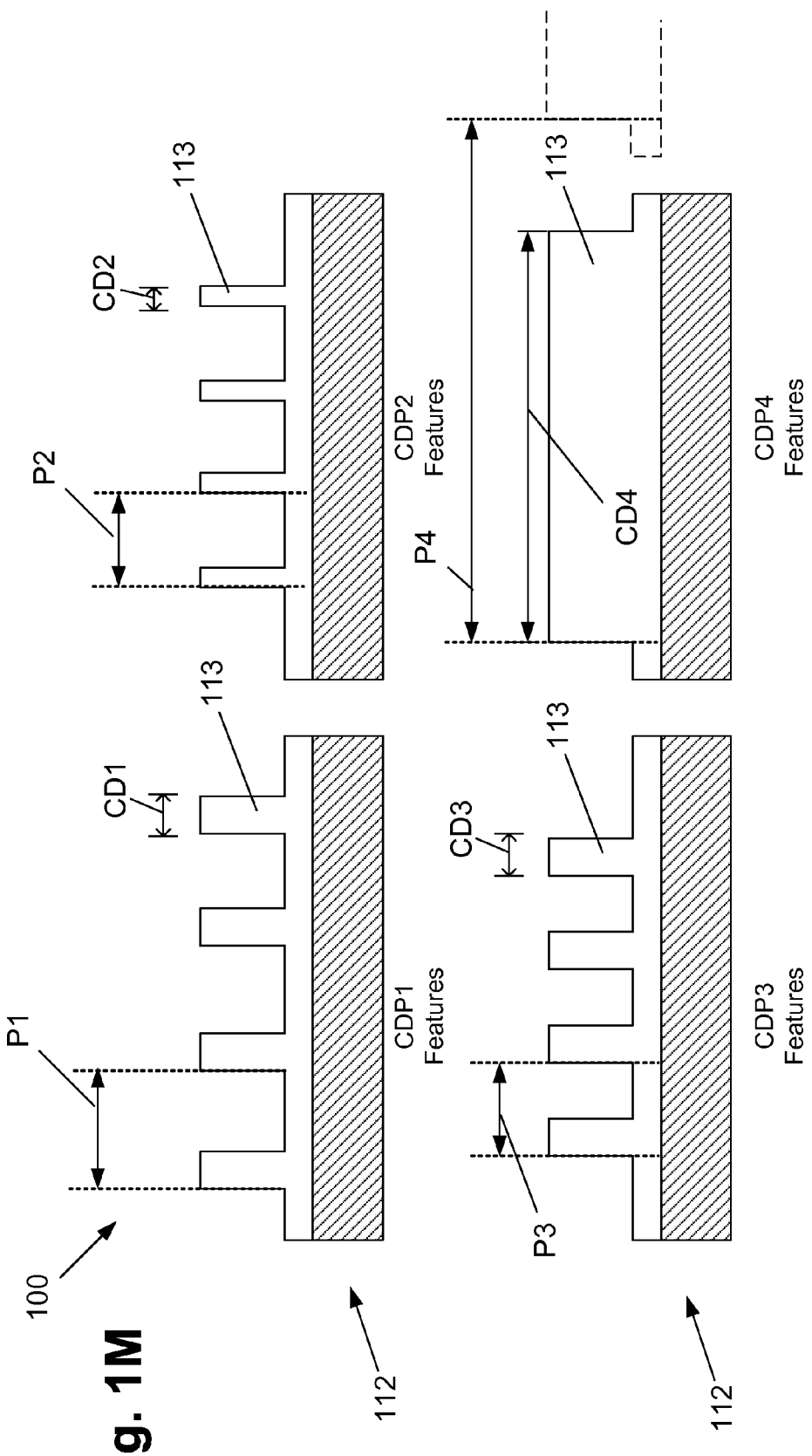

METHODS OF FORMING FEATURES HAVING DIFFERING PITCH SPACING AND CRITICAL DIMENSIONS

BACKGROUND OF THE DISCLOSURE

1. Field of the Disclosure

The present disclosure generally relates to the formation of semiconductor devices, and, more specifically, to various methods of forming features having differing pitch spacing and critical dimensions.

2. Description of the Related Art

The fabrication of advanced integrated circuits, such as CPUs, storage devices, ASICs (application specific integrated circuits) and the like, requires the formation of a large number of circuit elements in a given chip area according to a specified circuit layout, wherein field effect transistors (NMOS and PMOS transistors) represent one important type of circuit element used in manufacturing such integrated circuit devices. A field effect transistor, irrespective of whether an NMOS transistor or a PMOS transistor is considered, typically comprises doped source and drain regions that are formed in a semiconducting substrate that are separated by a channel region. A gate insulation layer is positioned above the channel region and a conductive gate electrode is positioned above the gate insulation layer. By applying an appropriate voltage to the gate electrode, the channel region becomes conductive and current is allowed to flow from the source region to the drain region.

Numerous processing operations are performed in a very detailed sequence, or process flow, to form integrated circuit devices, e.g., deposition processes, etching processes, heating processes, masking operations, etc. In general, the formation of integrated circuit devices involves, among other things, the formation of various layers of material and patterning or removing portions of those layers of material to define a desired structure, such as a gate electrode, a sidewall spacer, etc. Device designers have been very successful in improving the electrical performance capabilities of transistor devices, primarily by reducing the size of or "scaling" various components of the transistor, such as the gate length of the transistors. In fact, device dimensions on modern day transistors have been reduced to the point where direct patterning of such features is very difficult using existing photolithography tools and technology. Thus, device designers have employed various techniques to pattern very small features.

Device designers design chips comprised of transistors having different gate lengths formed on the same semiconductor substrate. For example, in the logic circuits of an integrated circuit product where switching speed and high performance is paramount, an integrated circuit product may be designed so as to only use high-performance, relatively smaller gate length transistor devices in such logic circuits. However, in other regions of the integrated circuit product where switching speed is not as critical, e.g., input/output circuits, the product may be designed so as to use transistor devices having relatively larger gate lengths in an effort to reduce the overall power consumption of the integrated circuit product.

The present disclosure is directed to various methods of patterning features that have differing pitch spacing and critical dimensions, such as gate lengths, wherein the features may be part of an integrated circuit product.

SUMMARY

The following presents a simplified summary in order to provide a basic understanding of some aspects of the disclosure. This summary is not an exhaustive overview. It is not intended to identify key or critical elements of the disclosure or to delineate the scope of the disclosure. Its sole purpose is to present some concepts in a simplified form as a prelude to the more detailed description that is discussed later.

Generally, the present disclosure is directed to various methods of forming features that have differing pitch spacing and critical dimensions. In one example, a method includes forming an underlying layer of material above a semiconductor substrate. The method further includes forming a masking layer above the underlying layer of material. The masking layer includes features positioned above a first region of the substrate and features positioned above a second region of the substrate. The features have different pitch spacing and critical dimensions. The method further includes performing at least one etching process on the underlying layer of material through the masking layer.

In another illustrative example, a method disclosed herein includes forming an underlying layer of material above a semiconductor substrate. The method further includes forming a masking layer above the underlying layer of material. The masking layer includes features positioned above a first region of the substrate and features positioned above a second region of the semiconductor substrate. The features have different pitch spacing and critical dimensions. The method further includes performing at least one etching process on the underlying layer of material through the masking layer. The method further includes removing the masking layer such that a patterned underlying layer of material remains above the semiconductor substrate. The patterned underlying layer of material includes underlying layer features positioned above the first region of the substrate and underlying layer features positioned above the second region of the substrate. The underlying layer features have different pitch spacing and critical dimensions.

In yet another illustrative example, a method disclosed herein includes forming an underlying layer of material above a semiconductor substrate. The method further includes forming a masking layer above the underlying layer of material. The masking layer includes features positioned above first, second, third and fourth regions of the substrate. None of the features have both the same pitch spacing and the same critical dimension. The method further includes performing at least one etching process on the underlying layer of material through the masking layer.

BRIEF DESCRIPTION OF THE DRAWINGS

The disclosure may be understood by reference to the following description taken in conjunction with the accompanying drawings, in which like reference numerals identify like elements, and in which:

FIGS. 1A-1M depict various illustrative methods disclosed herein of forming features that have differing pitch spacing and critical dimensions.

Figure 1B:
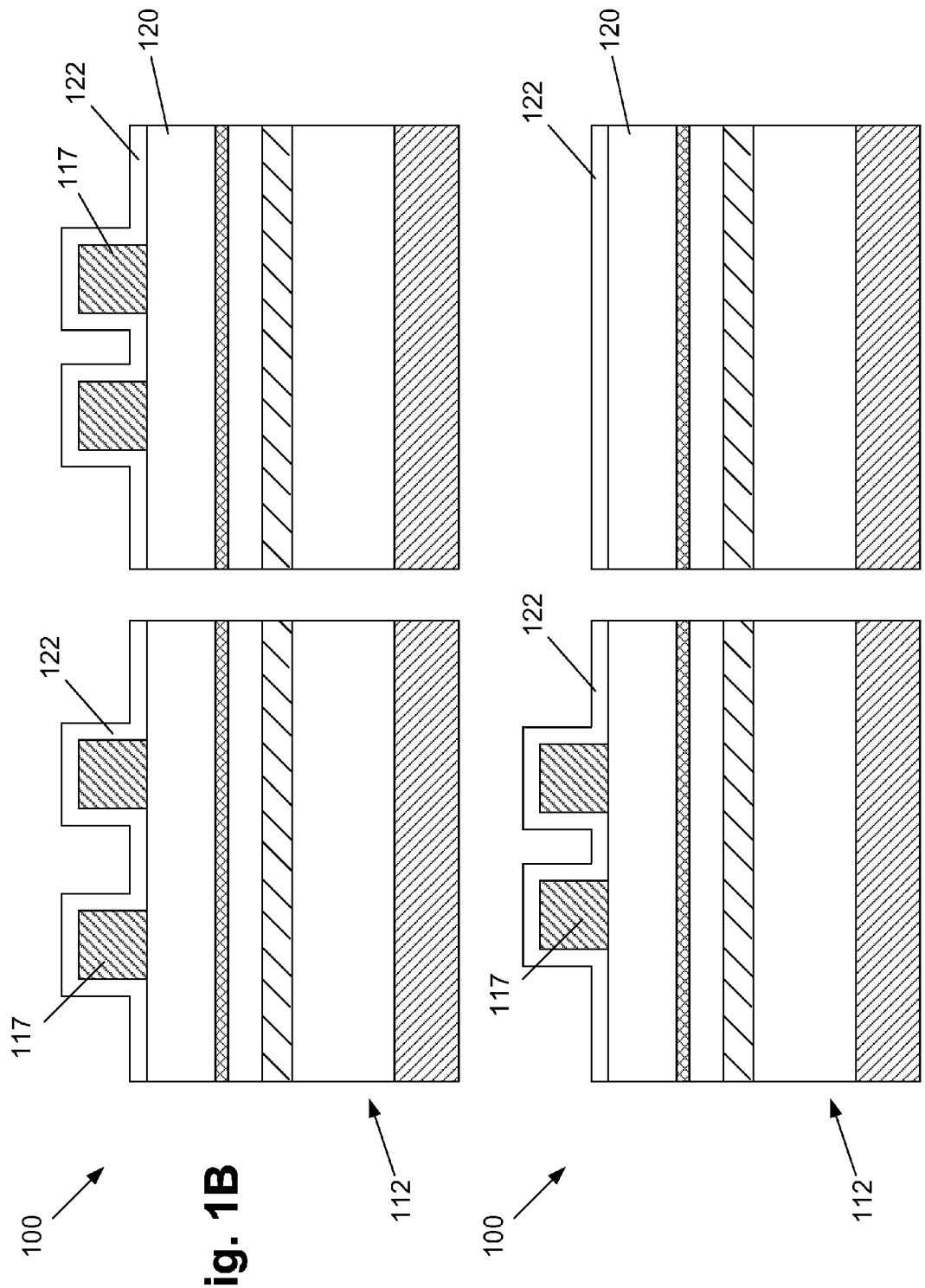

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

NOTATION AND NOMENCLATURE

Certain terms are used throughout the disclosure to refer to particular components. However, different entities may refer to a component by different names. This document does not intend to distinguish between components that differ in name but not function. The terms "including" and "comprising" are used herein in open-ended fashion, and thus mean "including, but not limited to."

DETAILED DESCRIPTION

Various illustrative embodiments of the invention are described below. In the interest of clarity, not all features of an actual implementation are described in this specification. It will of course be appreciated that, in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming features that have differing pitch spacing and critical dimensions. As will be readily apparent to those skilled in the art upon a complete reading of the present application, the present method is applicable to a variety of devices and integrated circuit products, including, but not limited to, ASICs, logic devices, memory devices, etc. Moreover, the present invention may be employed in forming any of a variety of different types of features formed on an integrated circuit product, such as lines, trenches, gate electrode structures, fins for FinFET devices, etc. Thus, the inventions disclosed herein should not be considered to be limited to any of the illustrative examples, devices or statements of use set forth herein. With reference to the attached drawings, various illustrative embodiments of the methods disclosed herein will now be described in more detail.

FIGS. 1A-1M depict illustrative methods disclosed herein for forming features having different pitch spacing and critical dimensions. Pitch spacing is the distance between identical features of two semiconductor structures. Critical dimension is the measurement of a minimum dimension of a significant semiconductor device element, such as a gate length of a transistor. FIG. 1A depicts an integrated circuit product 100 and four regions 112A, 112B, 112C, 112D of the same semiconductor substrate 112. As indicated, features having a first critical dimension and pitch spacing ("CDP1 Features") will be formed above the first region 112A, features having a second critical dimension and pitch spacing ("CDP2 Features") will be formed above the second region 112B, features having a third critical dimension and pitch spacing ("CDP3 Features") will be formed above the third region 112C, and features having a fourth critical dimension and pitch spacing ("CDP4 Features") will be formed above the fourth region 112D. The substrate 112 may take the form of an active layer of a silicon-on-insulator (SOI) substrate or it may also be in bulk silicon form. The substrate 112 may also be made of materials other than silicon. Thus, the terms "substrate" or "semiconductor substrate" as used herein and in the appended claims should be understood to cover all forms of any type of semiconductor material.

At the point of manufacture depicted in FIG. 1A, an underlying layer of material 113 to be patterned has been formed above the substrate 112. As will be appreciated by those skilled in the art after a complete reading of the present application, the layer of material 113 is intended to be representative in nature of any type of layer of material that may be subjected to patterning operations when manufacturing an integrated circuit product. For example, the layer of material 113 to be patterned may be a layer of gate electrode material, a layer of sacrificial gate electrode material, a layer of fin material, a layer of a conductive material for conductive lines, a layer of insulating material, etc. Additionally, a pattern masking layer 115 (which has not yet been patterned), including a spacer layer 114 and an insulating layer 116, has been formed above the substrate 112. Above the pattern masking layer 115, an etch stop layer 118 and a hard mask layer 120 have been formed. Also depicted in FIG. 1A are mandrel structures 117. The mandrel structures 117 may be formed by depositing a layer of mandrel material and thereafter patterning the layer of mandrel material using known photolithography tools and techniques. The width of the mandrels 117, the spacing between mandrels, and the thickness of the layer of mandrel material 117 may vary depending upon the application. Mandrel structures are not formed above the fourth substrate region 112D because devices having the longest channel length will be formed in the region 112D, e.g., long channel devices. In at least one embodiment, a long channel device refers to a device having a gate length greater than the gate length of the minimum gate length devices formed for the product, e.g., a long channel device may have a gate length measuring 40 nm or greater based upon current day technologies.

The various layers may be made of a variety of materials depending upon the application. In one illustrative example, the underlying layer of material 113 may be a layer of polysilicon, the spacer layer 114 may be a layer of silicon nitride and the insulating layer 116 may be a layer of silicon dioxide. The etch stop layer 118, the hard mask layer 120 and the mandrel structures 117 may be made of materials that are selectively etchable to each other and the surrounding layers. For example, the etch stop layer 118 may be a nitride while the hard mask layer 120 may be an oxide.

FIG. 1B illustrates the product 100 after a layer of spacer material 122 was deposited onto the hard mask layer 120 and the mandrel structures 117. For simplicity, various deposition processes may be illustrated with sharp corners though those corners may have a rounded configuration. The spacer material 122 may be selectively etched relative to the hard mask layer 120 and mandrel structures 117. The thickness of the spacer material 122 may vary depending upon the pitch spacing and critical dimensions desired in conjunction with the spacer layers discussed below.

Figure 1C:
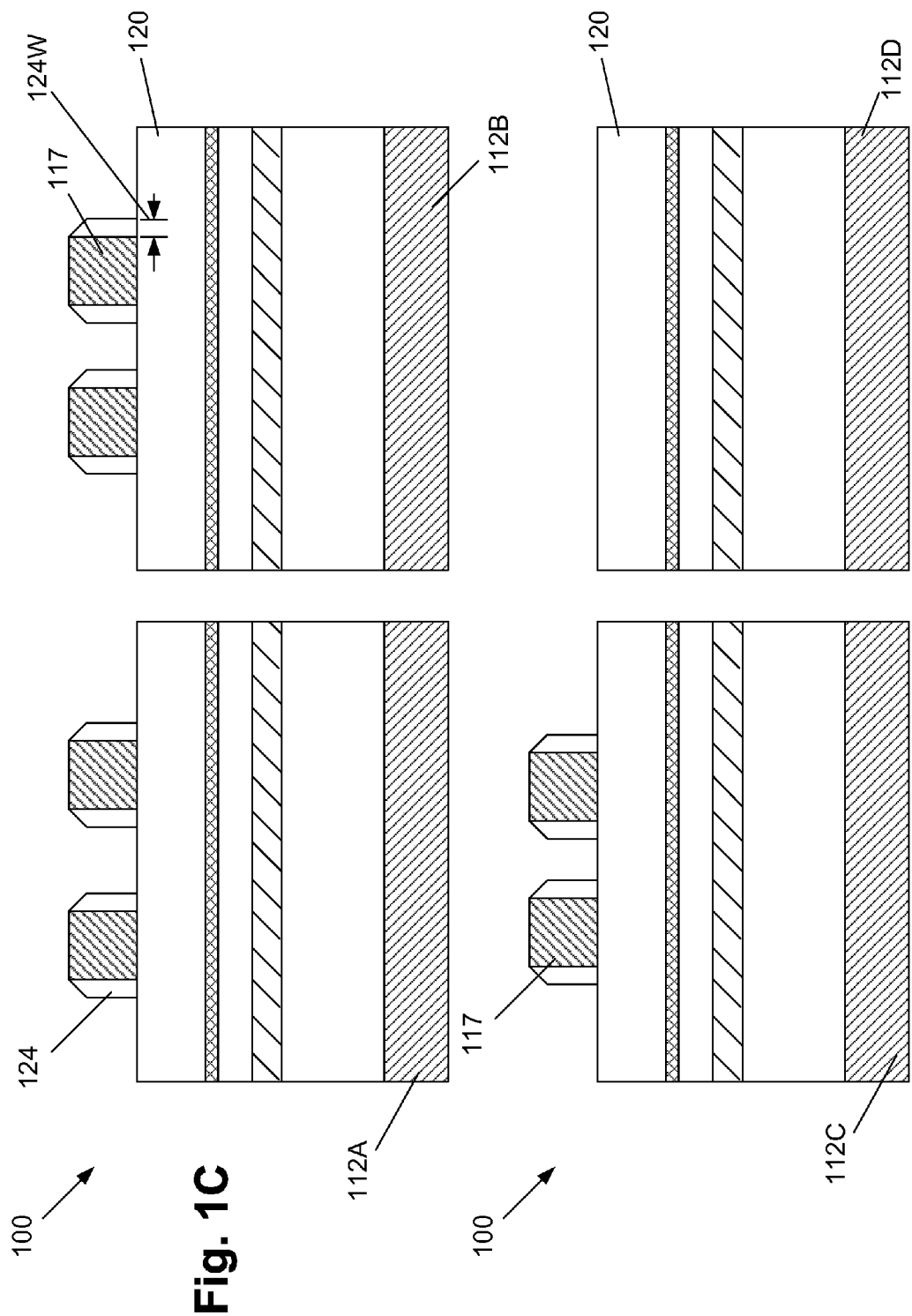

FIG. 1C illustrates the product 100 after an anisotropic etching process was performed on the spacer material 122 to define a plurality of spacers 124 adjacent to the mandrel structures 117 above the first, second and third substrate regions 112A-C. The etching process also removed any horizontally-positioned spacer material 122 in all four substrate regions 112A-D. The spacers 124 have an initial width 124W.

Figure 1D:
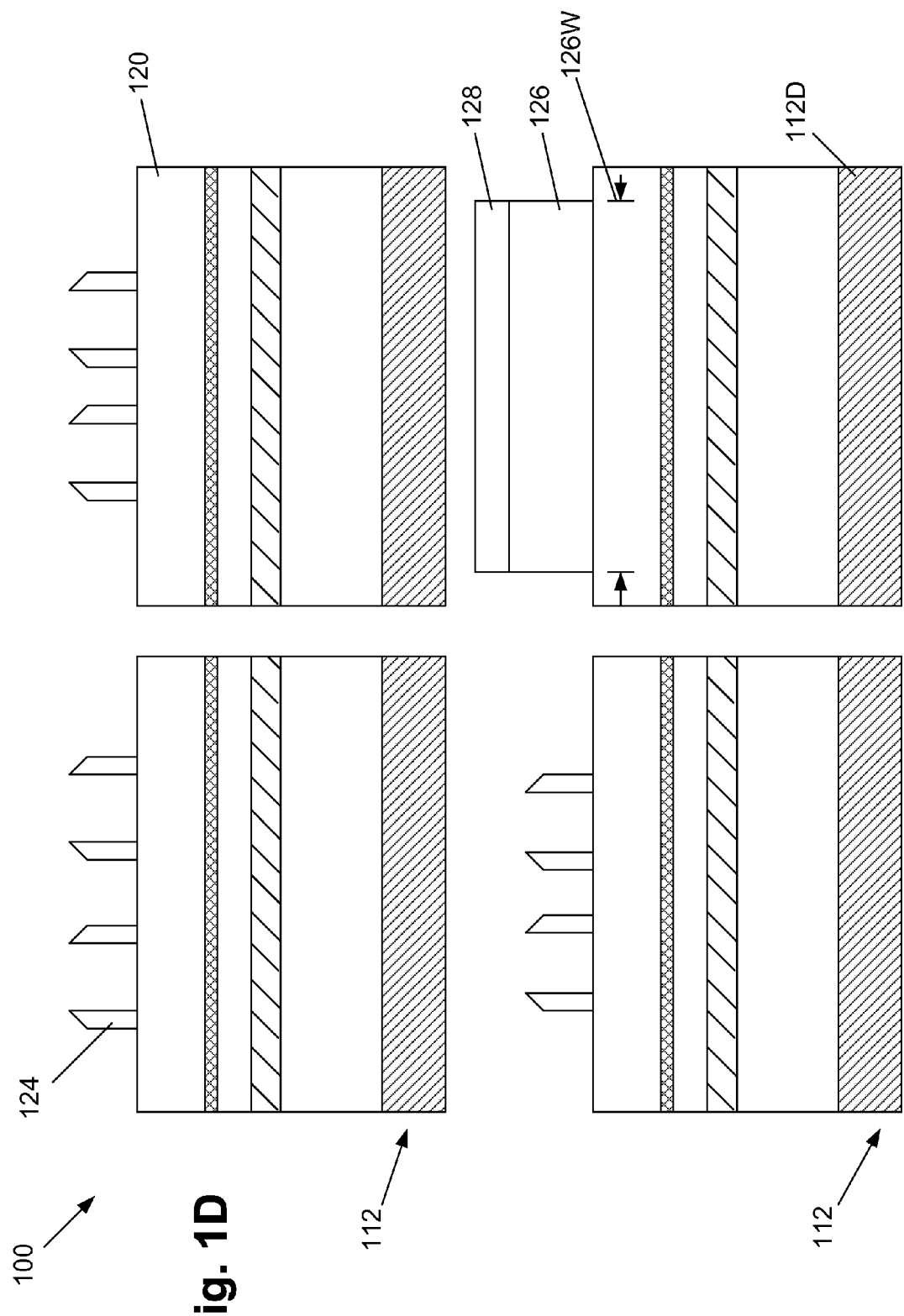

FIG. 1D depicts the product 100 after several process operations were performed. First, a selective etching process removed the mandrel structures 117 relative to the spacers 124 and hard mask layer 120. Next, a protective layer 126 and anti-reflective coating (ARC) layer 128 were deposited onto the product 100 and patterned such that the two layers remained above the fourth substrate region 112D only. The protective layer 126 is patterned so as to have a width 126W. In at least one embodiment, the protective layer 126 is an optical planarization layer (OPL), which may be formed by performing a spin-coating process and thereafter drying the OPL material. The ARC layer 128 may be made of a variety of materials in various embodiments, such as silicon nitride, silicon oxynitride, silicon, or carbon containing organic polymers, etc., depending upon the application. The formation of the protective layer 126 and ARC layer 128 may occur before etching of the mandrel structures 117 in various embodiments.

FIG. 1E depicts the product 100 after several process operations were performed. First, an anisotropic etch was performed to pattern the hard mask layer 120, i.e., to remove the portions of the hard mask layer 120 not covered by the spacers 124 or the protective layer 126 using the etch stop layer 118 as an etch stop. Next, a stripping process was performed to remove the ARC layer 128. The pitch spacing of the features above the first substrate region 112A is P1, the pitch spacing of the features above the second substrate region 112B is P2, the pitch spacing of the features above the third substrate region 112C is P3, and the pitch spacing of the features above the fourth substrate region 112D is P4. In some embodiments, the pitch spacings P1-P4 may all be different. In other embodiments, some of the pitch spacings may be the same while other pitch spacings may be different depending upon the application. In at least one illustrative embodiment, P1 is approximately 48 nm, P2 is approximately 44 nm, P3 is approximately 44 nm, and P4 is approximately 88 nm.

FIG. 1F illustrates the product 100 after one or more etch processes were performed to remove the spacers 124 and the protective layer 126 relative to the hard mask layer 120. This results in a patterned hard mask layer 120 that is positioned above all four regions of the device.

FIG. 1G illustrates the product 100 after a second spacer layer 130 was deposited onto the etch-stop layer 118 and the patterned hard mask layer 120. In at least one embodiment, the second spacer layer 130 may be approximately 1.5 nm thick. The combined hard mask/second spacer layer structure 120/130 has a combined width 131 that is greater than the width 124W of the spacers 124 (see FIG. 1C). As discussed more fully below, the second spacer layer 130 will eventually be patterned to define sidewall spacers in the regions 112A and 112C only, thereby selectively increasing the width or the critical dimension of the masking features only in those regions (112A, 112C).

Figure 1H:
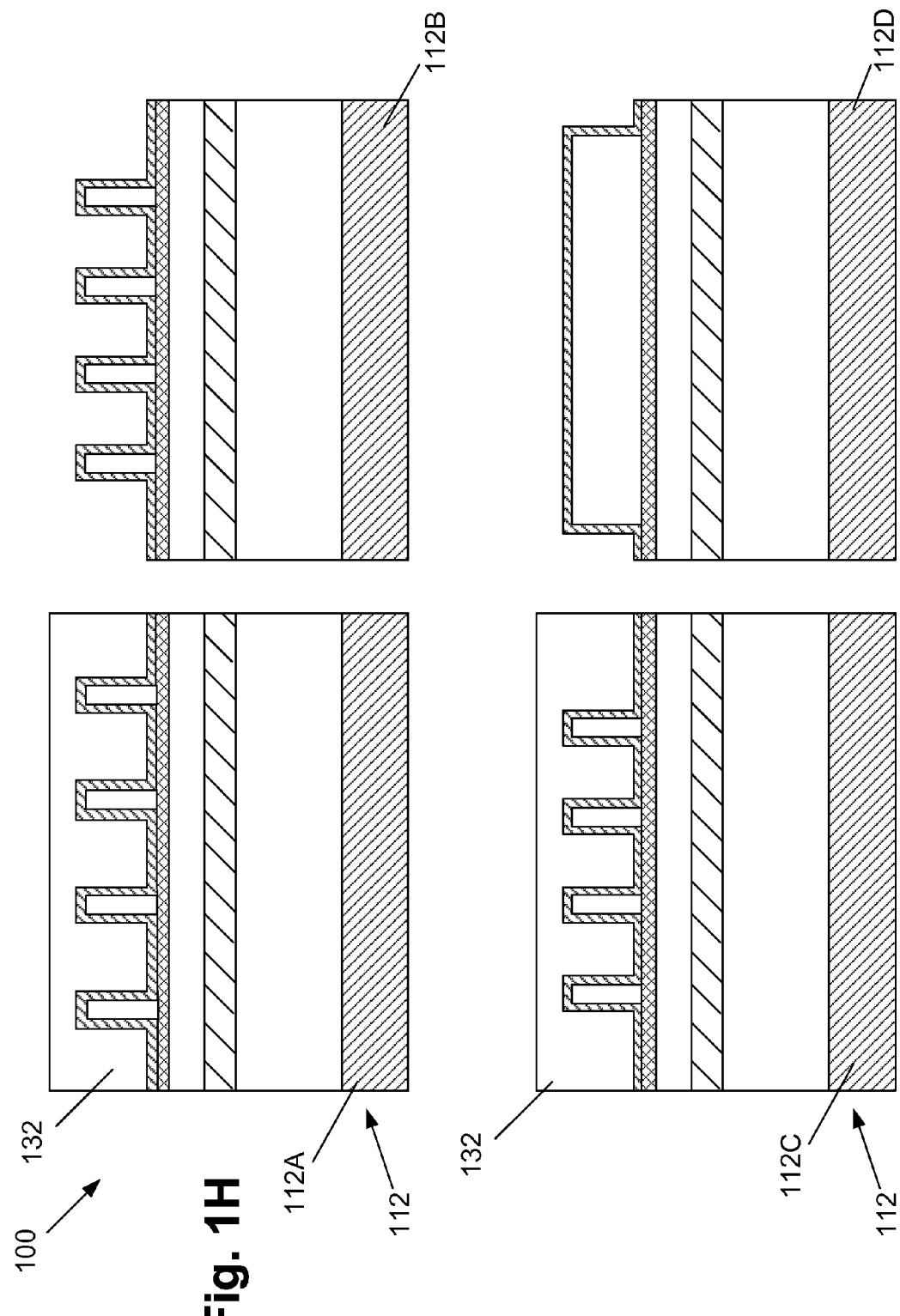

FIG. 1H illustrates the product 100 after a patterned masking layer 132, e.g. a layer of photoresist, was formed on the product 100. In one illustrative embodiment, the patterned masking layer 132 is not present above the second 112B and fourth 112D regions of the substrate 112. Depending upon the application, the patterned masking layer 132 may be removed from different combinations of regions of the substrate 112.

FIG. 1I illustrates the product 100 after an etching process was performed to remove the second spacer layer 130 from over the second 112B and fourth 112D regions of the substrate 112. The patterned masking layer 132 protects the second spacer layer 130 above the first 112A and third 112C regions of the substrate 112 from the etching process. Other combinations of masking the various regions of the substrate 112 may be used in various embodiments depending upon the application.

Figure 1J:
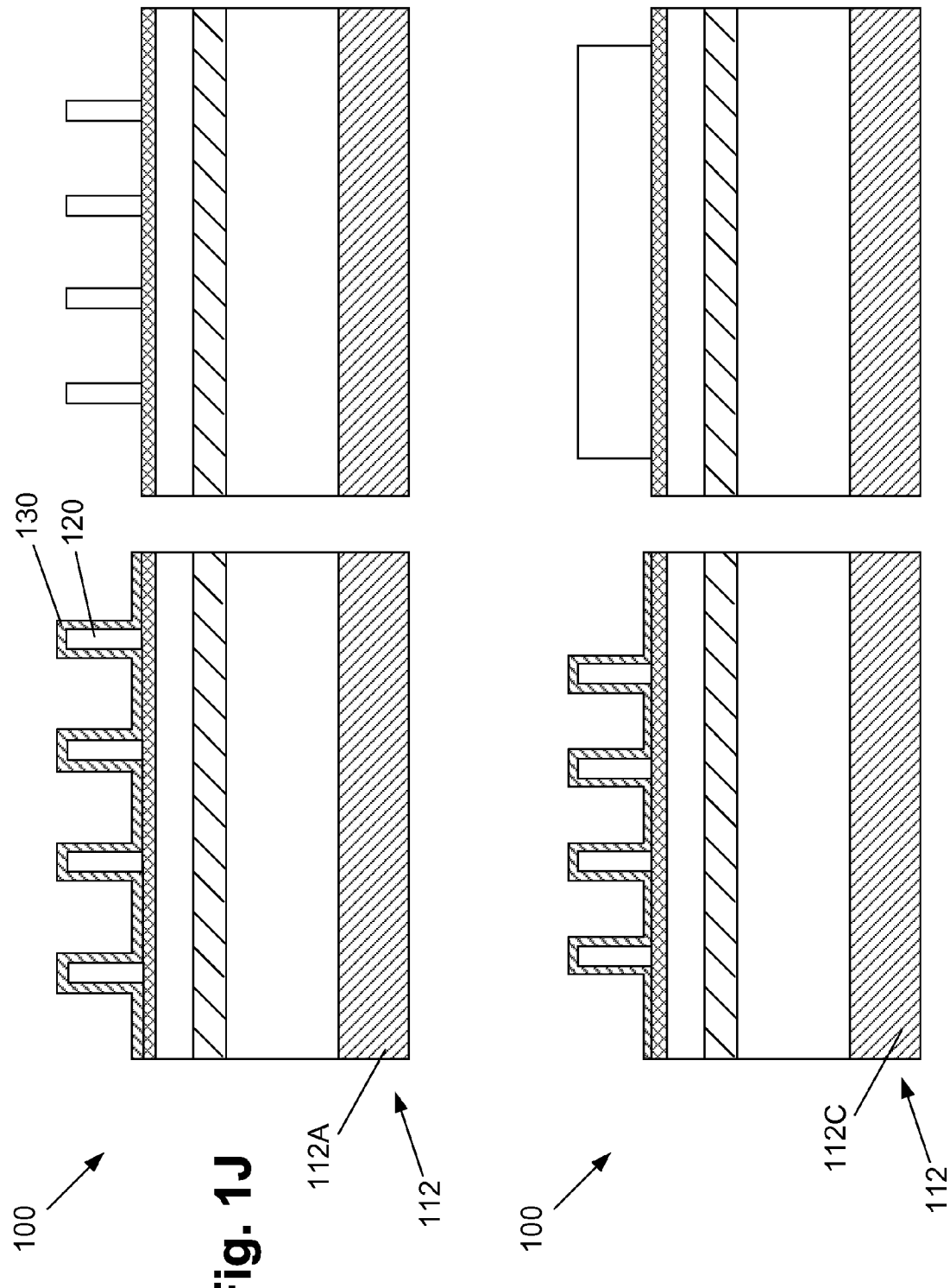

FIG. 1J illustrates the product 100 after the patterned masking layer 132 was removed from above the substrate regions 112A and 112C. In some embodiments, additional spacer layers may be added to further diversify the critical dimensions of the features above the various substrate regions. For example, a third spacer layer (not shown) may be deposited and patterned using the above-described process to further widen or increase the critical dimension of the features above only the substrate region 112A. In this way, both the pitch spacing and the critical dimensions of features may vary between features on the same substrate. In at least one embodiment, no two substrate regions 112A-112D have features with both the same pitch spacing and the same critical dimension.

Figure 1K:
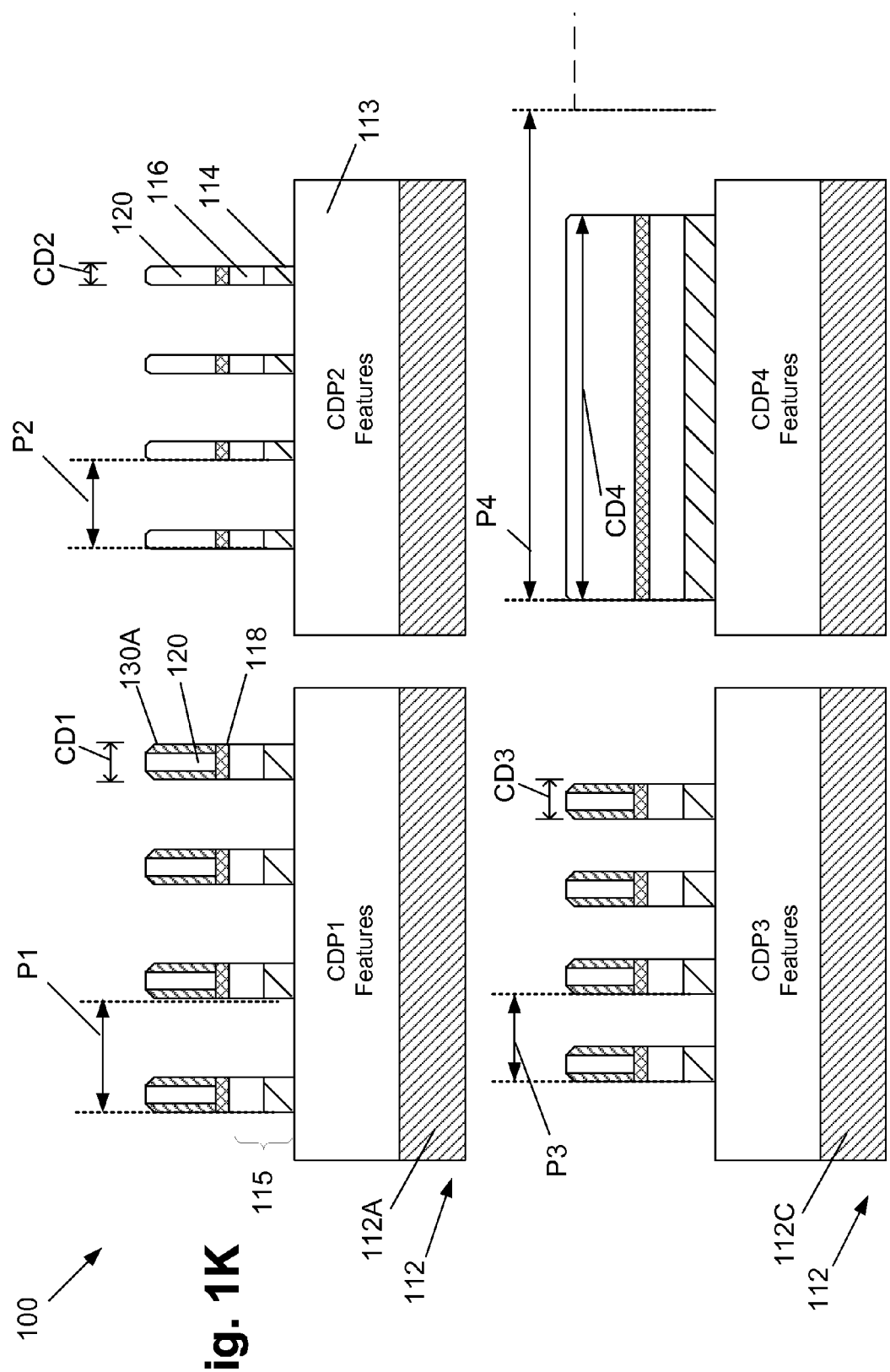

FIG. 1K illustrates the product 100 after several process operations were performed. First, an anisotropic etching process was performed on the second spacer layer 130 to define a plurality of spacers 130A adjacent to the portions of the features of the patterned hard mask layer 120 above the first and third substrate regions 112A, 112C. Next, one or more etching processes were performed to pattern the masking layer 115 using the patterned hard mask layer 120 and the spacers 130A (present in regions 112A and 112C only) as a mask. The patterned masking layer 115 above each region of the substrate 112 has a different critical dimension and pitch spacing combination than the pattern masking layer 115 above the other regions 112A-D. Ultimately, the features in the patterned masking layer 115 will be transferred to the layer of underlying material 113 by performing one or more etching processes. In one particular example, the CDP1 features may include a pitch spacing P1 of approximately 48 nm and a critical dimension CD1 of approximately 18 nm, the CDP2 features may include a pitch spacing P2 of approximately 44 nm and a critical dimension CD2 of approximately 15 nm, the CDP3 features may include a pitch spacing P3 of approximately 44 nm and a critical dimension CD3 of approximately 18 nm, and the CDP4 features may include a pitch spacing P4 of approximately 88 nm and a critical dimension CD4 of approximately 30 nm. Additionally, it should be noted that the dual-layer masking layer 115 (comprised of layers 114 and 116) is provided by way of example only. Such a multiple layer construction for the masking layer 115 may not be required in all applications.

FIG. 1L illustrates the product 100 after several process operations were performed. First, one or more etching processes were performed to remove the spacers 130A, the patterned hard mask layer 120 and the etch stop layer 118. This leaves the patterned masking layer 115 positioned above the material layer 113. Then, one or more etching processes were performed though the patterned masking layer 115 to define a plurality of underlying layer features within the underlying material layer 113.

FIG. 1M illustrates the product 100 after one or more etching processes were performed to remove the patterned masking layer 115. Note that, using the novel methods disclosed herein, the features of the underlying layer of material 113 positioned above the different substrate regions have different pitch spacing and critical dimension combinations, i.e., the pitch spacing and critical dimensions from the patterned masking layer 115 described above. Depending upon the application, various other pitch spacings and critical dimensions may be implemented as well.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. Note that the drawings included herein are not to scale and the relative size of various features, layers and structures may be exaggerated to facilitate explanation. It is, therefore, evident that the particular embodiments disclosed above may be altered or modified and all such variations are considered within the scope and spirit of the invention. Accordingly, the protection sought herein is as set forth in the claims below.

What is claimed:

1. A method, comprising:
   forming a layer of material above a semiconductor substrate;
   forming a masking layer above said layer of material, said masking layer comprising a first plurality of features positioned above a first region of said semiconductor substrate and a second plurality of features positioned above a second region of said semiconductor substrate, said first plurality of features comprising a different pitch spacing and a different critical dimension than said second plurality of features;
   depositing a spacer layer on said first and second pluralities of features and patterning said spacer layer to remove said spacer layer from said second plurality of features; and
   performing at least one etching process on said layer of material through said masking layer and said patterned spacer layer.

2. The method of claim 1, wherein said spacer layer is at least approximately 1.5 nm thick.

3. The method of claim 1, wherein said layer of material comprises a layer of gate electrode material.

4. The method of claim 1, wherein said layer of material comprises a layer of insulating material.

5. The method of claim 1, wherein said layer of material comprises a layer of fin material.

6. The method of claim 1, wherein said masking layer comprises a third plurality of features positioned above a third region of said semiconductor substrate and a fourth plurality of features positioned above a fourth region of said semiconductor substrate, and wherein said first, second, third and fourth pluralities of features all have different pitch spacing and critical dimension combinations.

7. The method of claim 6, further comprising depositing said spacer layer on said first, second, third and fourth pluralities of features and patterning said spacer layer to remove said spacer layer from at least one of said pluralities of features.

8. The method of claim 7, further comprising depositing a second spacer layer above said first, second, third and fourth pluralities of features and patterning said second spacer layer to remove said second spacer layer from at least one of said pluralities of features.

9. The method of claim 6, wherein said first plurality of features comprises a pitch spacing of approximately 48 nm and a critical dimension of approximately 18 nm, wherein said second plurality of features comprises a pitch spacing of approximately 44 nm and a critical dimension of approximately 15 nm, wherein said third plurality of features comprises a pitch spacing of approximately 44 nm and a critical dimension of approximately 18 nm, and wherein said fourth plurality of features comprises a pitch spacing of approximately 88 nm and a critical dimension of approximately 30 nm.

10. The method of claim 1, wherein performing said at least one etching process on said layer of material through said masking layer results in the formation of a patterned underlying layer of material comprising a first plurality of underlying layer features positioned above said first region of said semiconductor substrate and a second plurality of underlying layer features positioned above said second region of said semiconductor substrate, wherein said first plurality of underlying layer features comprises a different pitch spacing and critical dimension than said second plurality of underlying layer features.

11. The method of claim 1, wherein said first plurality of features comprises a pitch spacing of approximately 48 nm and a critical dimension of approximately 18 nm, and wherein said second plurality of features comprises a pitch spacing of approximately 44 nm and a critical dimension of approximately 15 nm.

12. The method of claim 1, wherein said first plurality of features comprises a pitch spacing of approximately 44 nm and a critical dimension of approximately 18 nm, and wherein said second plurality of features comprises a pitch spacing of approximately 44 nm and a critical dimension of approximately 15 nm.

13. The method of claim 1, wherein said first plurality of features comprises a pitch spacing of approximately 88 nm and a critical dimension of approximately 30 nm, and wherein said second plurality of features comprises a pitch spacing of approximately 44 nm and a critical dimension of approximately 15 nm.

14. The method of claim 1, wherein said masking layer comprises an oxide sublayer.

15. A method, comprising:
    forming a layer of material above a semiconductor substrate;
    forming a masking layer above said layer of material, said masking layer comprising a first plurality of features positioned above a first region of said semiconductor substrate and a second plurality of features positioned above a second region of said semiconductor substrate, said first plurality of features comprising a different pitch spacing and a different critical dimension than said second plurality of features;
    depositing a spacer layer on said first and second pluralities of features and patterning said spacer layer to remove said spacer layer from said plurality of features;
    performing at least one etching process on said layer of material through said masking layer and said patterned spacing layer; and removing said masking layer such that a patterned underlying layer of material remains above said semiconductor substrate, said patterned underlying layer of material comprising features corresponding to said different pitch spacing and said different critical dimension of said first and second pluralities of features.

16. The method of claim 15, wherein said layer of material comprises gate electrode material.

17. The method of claim 15, wherein said underlying layer of material comprises fin material.

18. A method, comprising:

forming a layer of material above a semiconductor substrate;

forming a masking layer above said layer of material, said masking layer comprising a first plurality of features positioned above a first region of said semiconductor substrate, a second plurality of features positioned above a second region of said semiconductor substrate, a third plurality of features positioned above a third region of said semiconductor substrate, and a fourth plurality of features above a fourth region of said semiconductor substrate, said first, second, third and fourth pluralities of features comprising different pitch spacing and critical dimension combinations;

depositing a spacer layer on said first, second, third and fourth pluralities of features;

patterning said layer to remove said spacer layer from at least one of said pluralities of features; and performing at least one etching process on said layer of material through said masking layer and said patterned spacer layer.

* * * * *

UNITED STATES PATENT AND TRADEMARK OFFICE
CERTIFICATE OF CORRECTION

PATENT NO. : 9,449,835 B2  
APPLICATION NO. : 14/676097  
DATED : September 20, 2016  
INVENTOR(S) : Linus Jang and Ryan Ryoung-Han Kim Page 1 of 1

It is certified that error appears in the above-identified patent and that said Letters Patent is hereby corrected as shown below:

In the Claims

Column 8, Line 64 (Claim 15, Line 14), change "said plurality" to "said second plurality".

Column 9, Line 27 (Claim 18, Line 14), change "said layer" to "said spacer layer".

Signed and Sealed this
Twenty-first Day of February, 2017

Michelle K. Lee
*Director of the United States Patent and Trademark Office*